(12) United States Patent
Gombos

(10) Patent No.: US 10,840,422 B2
(45) Date of Patent: Nov. 17, 2020

(54) REFLECTIVE LAYER FOR AN ILLUMINATION DEVICE

(71) Applicant: FURUKAWA ELECTRIC CO., LTD., Tokyo (JP)

(72) Inventor: Akos Gombos, Budapest (HU)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/521,400

(22) Filed: Jul. 24, 2019

(65) Prior Publication Data

US 2019/0348586 A1 Nov. 14, 2019

Related U.S. Application Data

(63) Continuation of application No. PCT/JP2018/002280, filed on Jan. 25, 2018.

(30) Foreign Application Priority Data

Jan. 25, 2017 (JP) .................................. 2017-010963

(51) Int. Cl.
*H01L 33/00* (2010.01)
*H01L 31/0203* (2014.01)
(Continued)

(52) U.S. Cl.
CPC ................ *H01L 33/60* (2013.01); *F21V 7/24* (2018.02); *F21V 7/28* (2018.02); *H01L 33/26* (2013.01);
(Continued)

(58) Field of Classification Search
CPC ...... H01L 33/60; H01L 33/62; H01L 51/5237; H01L 21/56; H01L 25/048; H01L 33/26; F21V 7/28; F21V 7/24
See application file for complete search history.

(56) References Cited

U.S. PATENT DOCUMENTS

| 5,918,396 A | 7/1999 | Jung | |
|---|---|---|---|
| 2005/0151147 A1* | 7/2005 | Izuno | ..................... H01L 33/505 257/98 |

(Continued)

FOREIGN PATENT DOCUMENTS

| EP | 2 080 947 A1 | 7/2009 |
|---|---|---|
| JP | 2009-231584 A | 10/2009 |

(Continued)

OTHER PUBLICATIONS

International Search Report for PCT/JP2018/002280 (PCT/ISA/210) dated Feb. 20, 2018.

(Continued)

*Primary Examiner* — Alonzo Chambliss

(74) *Attorney, Agent, or Firm* — Birch, Stewart, Kolasch & Birch, LLP

(57) ABSTRACT

To provide an illumination device that has a simple configuration and can be assembled easily, and can reduce production cost.

An illumination device includes a light source, a reflective layer disposed to reflect light from the light source and to direct the light out of the illumination device to provide illumination, a base layer made of thermoformed resin provided at the reflective layer to hold the light source, and conductors disposed on the base layer and connected to the light source to supply power to the light source.

24 Claims, 9 Drawing Sheets

(51) Int. Cl.
*H01L 21/00* (2006.01)
*H01L 51/40* (2006.01)
*H01L 33/60* (2010.01)
*F21V 7/28* (2018.01)
*F21V 7/24* (2018.01)
*H01L 33/62* (2010.01)
*H01L 33/26* (2010.01)

(52) U.S. Cl.
CPC .... *H01L 33/62* (2013.01); *H01L 2924/12041* (2013.01)

(56) References Cited

U.S. PATENT DOCUMENTS

| | | | |
|---|---|---|---|
| 2008/0188020 A1 | 8/2008 | Wei-Min et al. | |
| 2012/0262902 A1 | 10/2012 | Pickard et al. | |
| 2013/0214319 A1* | 8/2013 | Lee | H01L 33/486 257/99 |
| 2014/0021506 A1* | 1/2014 | Yamada | H01L 33/52 257/99 |
| 2014/0203728 A1* | 7/2014 | Yang | H05B 45/24 315/294 |
| 2015/0236230 A1* | 8/2015 | Miyata | H01L 33/62 257/98 |

FOREIGN PATENT DOCUMENTS

| | | |
|---|---|---|
| JP | 2013-93379 A | 5/2013 |
| JP | 2015-72920 A | 4/2015 |
| JP | 2016-51798 A | 4/2016 |

OTHER PUBLICATIONS

Written Opinion of the International Searching Authority for PCT/JP2018/002280 (PCT/ISA/237) dated Feb. 20, 2018.

International Preliminary Report on Patentability and English translation of the Written Opinion of the International Searching Authority (Forms PCT/IB/373 and PCT/ISA/237) for International Application No. PCT/JP2018/002280, dated Jul. 30, 2019.

* cited by examiner

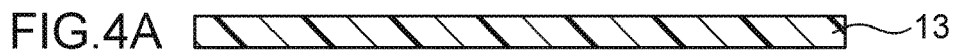
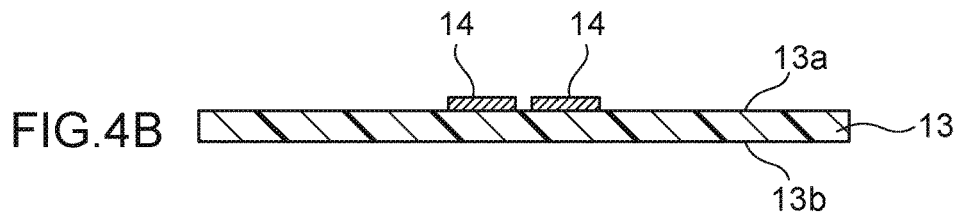
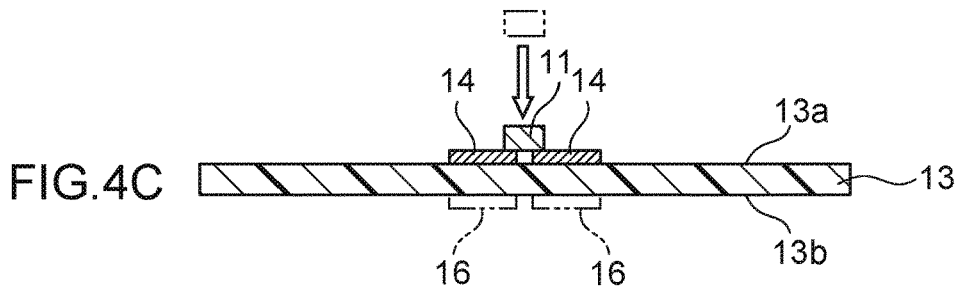
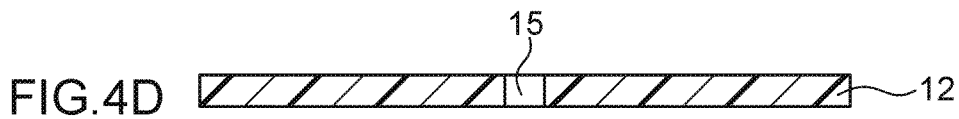
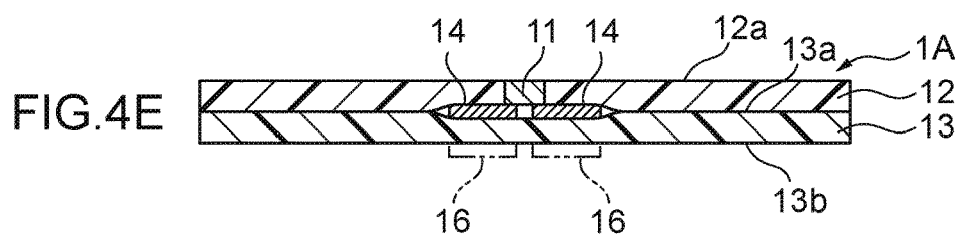
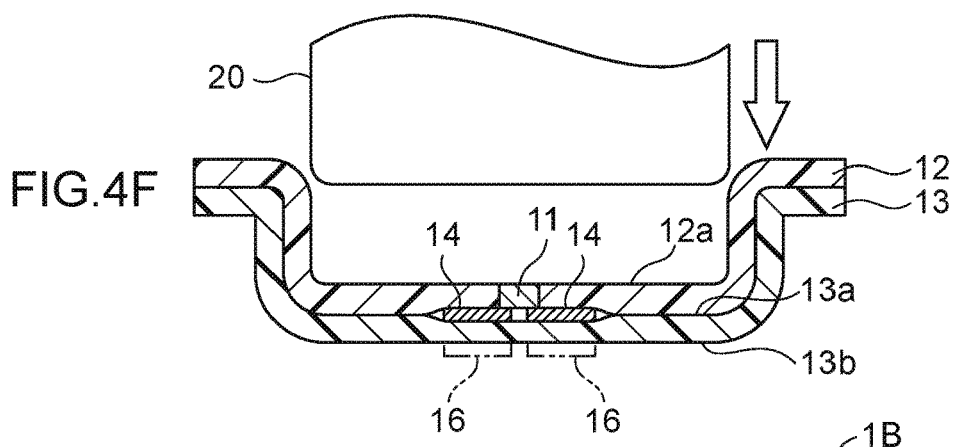
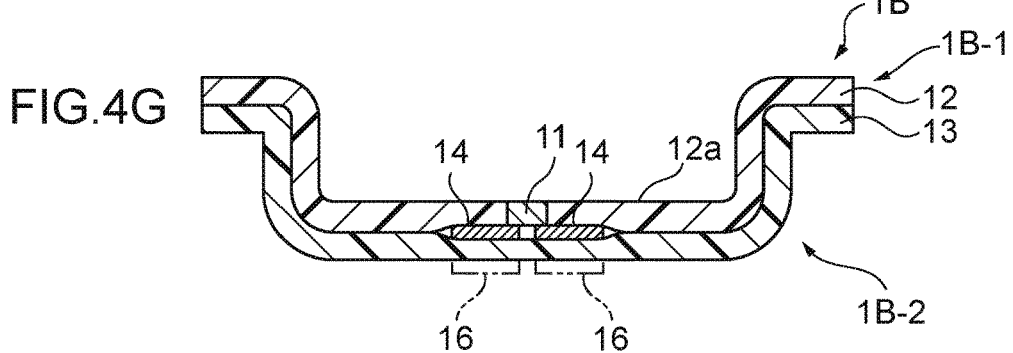

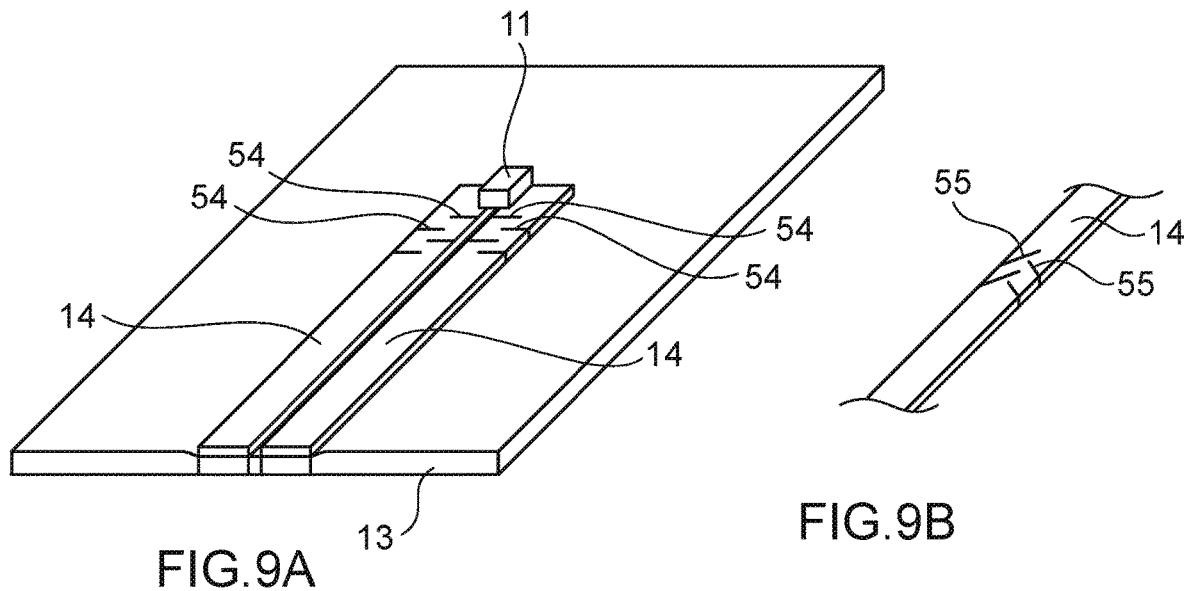
FIG.9A
FIG.9B
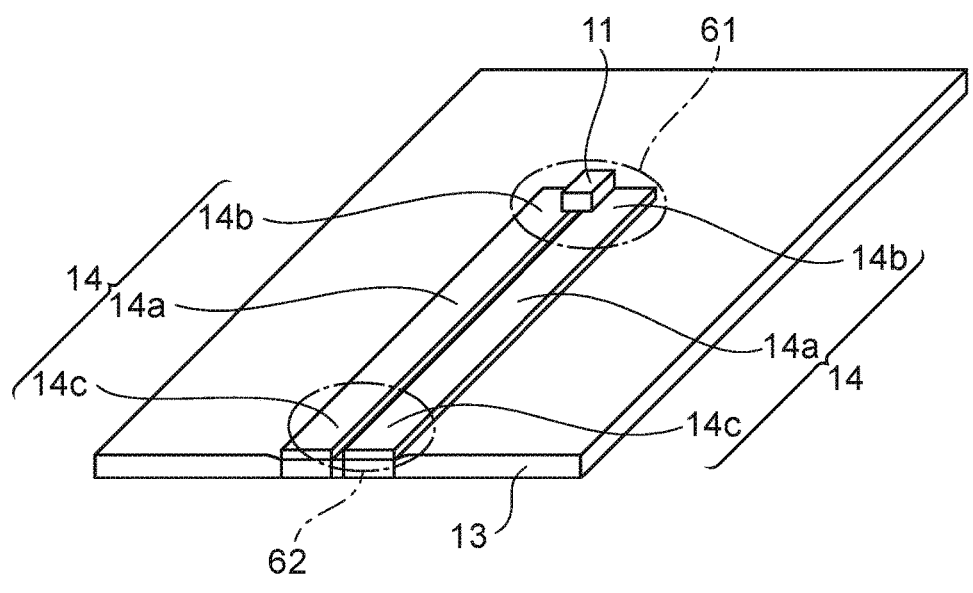
FIG.10

REFLECTIVE LAYER FOR AN ILLUMINATION DEVICE

CROSS REFERENCE TO RELATED APPLICATIONS

This is a continuation application of International Patent Application No. PCT/JP2018/002280 filed Jan. 25, 2018, which claims the benefit of Japanese Patent Application No. 2017-010963, filed Jan. 25, 2017, the full contents of all of which are hereby incorporated by reference in their entirety.

TECHNICAL FIELD

The invention relates an illumination device that reflects light emitted from a light source and a manufacturing method thereof, and particularly relates to an illumination device comprising a laminated structure obtained by laminating a thermoformable sheet substrate and a reflective sheet and a method of manufacturing the same.

BACKGROUND ART

As an example of conventional illumination devices, an illumination sign assembly has been disclosed which comprises a reflective housing made of a thermoformed resin having a linear semicircular inner surface lined by highly reflective resin sheet and a clear resin sheet having a smaller dimension of cut off opening area whereby a sign face is covered to pass light energy emitted from a light source enclosed in the reflective housing (see U.S. Pat. No. 5,918, 396).

Also, a conventional illumination device has been disclosed which comprises an LED light source, a reflector to reflect light from the LED light source and direct light outside to provide illumination, and a diffuser lens assembly comprising two lens plates. The illumination device is provided with a heatsink having a mounting surface on which a light source such as a group of LEDs can be mounted, and the light source can be mounted flat on the mounting surface to face the reflector that is assembled at the top of the housing. The reflector is designed to have various shapes to provide a particular optical function (see United States Patent Application Publication No. 2012/0262902).

SUMMARY OF INVENTION

However, conventional illumination devices as described above require various functional members such as a body, an LED light source, a reflector, a heatsink, and a conducting wire that need to be fabricated separately and individually. Further, it is necessary to assemble such functional members during the manufacture, and thus the manufacturing process becomes complicated and operations thereof become cumbersome.

If the manufacturing process of the illumination device can be simplified, production costs can be reduced and productivity can be improved. However, the conventional illumination devices described above require design costs and production costs for each of the functional members and further requires assembly costs, thus resulting in an increased production costs for the illumination devices. Particularly, since electric members, mechanical members and optical members of the conventional illumination devices are generally fabricated by different manufacturers at different locations, transportation costs for each member incidentally occur. Also, since the plurality of members of the conventional illumination devices are designed and produced different manufacturers, a multi-stage assembly technique is eventually required.

It is an object of the invention to provide an illumination device having a simple structure that can be assembled in a facilitated manner and with reduced costs, and a method of manufacturing such an illumination device.

In order to achieve the above mentioned object, an illumination device according to invention is characterized by comprising at least one light source, a reflective layer disposed to reflect light from the at least one light source and to direct the light out of the illumination device to provide illumination, a base layer of a thermoformed resin to hold the at least one light source and to hold the reflective layer, and a plurality of conductors disposed on the base layer and connected to the at least one light source to supply power to the at least one light source.

It is preferable that the at least one light source includes at least one LED light source.

It is preferable that the reflective layer is made of a thermoformable resin.

It is preferable that the reflective layer is made of foamed polyethylene terephthalate.

It is preferable that the reflective layer has a thickness of 0.01 mm to 5 mm, and further preferably, 0.5 mm to 1 mm.

The base layer is disposed to assemble the at least one light source and the plurality of conductors thereon.

It is preferable that the base layer is a printed circuit board.

It is preferable that the base layer has a thickness of 0.1 mm to 10 mm, and more preferably, 1 mm to 2 mm.

It is preferable that the conductor has a conductor compensation portion which compensates for elongation of the conductor in a longitudinal direction.

The conductor compensation portion may be a projection portion protruding from an outer edge portion of the base layer.

The conductor compensation portion may be a bent portion in which a part of the conductor is bent with respect to the longitudinal direction thereof.

The conductor compensation portion may have at least one recessed portion extending in a direction crossing the longitudinal direction.

A portion of the conductor corresponding to a portion in which the reflective layer and the base layer together undergo shape deformation during forming is not joined to the base layer, and the other portion of the conductor corresponding to a portion in which neither of the reflective layer nor the base layer undergoes shape deformation may be joined to the base layer.

It is preferable that the plurality of conductors are made of one of sheet metal, metal pad, metal foil, wire rod and patterned conductor, and more preferably, patterned conductors on a printed circuit board.

The illumination device further comprises at least one through-hole portion provided in the reflective layer to emit light from the at least one light source to outside.

Further, the reflective layer and the base layer have an identical shape.

The reflective layer is assembled onto the base layer with a plurality of conductors being located between the reflective layer and the base layer.

The at least one light source is a single LED light source assembled onto a surface of the base layer, and the at least one through-hole has a single through-hole portion positioned at a position corresponding to the single LED light source so that light from the single LED light source either leaves directly the illumination device through the single through-hole portion or is reflected back from the surface of the opposite side of the reflective layer which is not connected to the base layer.

The plurality of conductors have a terminal portion for connecting a power supply to the single LED light source.

In order to achieve the above mentioned object, a method of manufacturing an illumination device is characterized by including preparing a reflective layer as a thermoformable resin sheet, preparing a base layer as a thermoformed resin sheet, providing a plurality of conductors on a surface of the base layer, providing a terminal portion of the plurality of conductors to supply power to at least one light source, providing the at least one light source whereto the plurality of conductors are connected on a surface of the base layer, providing at least one through-hole portion in the reflective layer, placing the reflective layer on the base layer so that the plurality of conductors are positioned between the reflective layer and the base layer, and positioning the reflective layer on the base layer so that light from the at least one light source either leaves directly the illumination device through the at least one through-hole portion or is reflected back from a surface on an opposite side of the reflective layer that is not connected to the base layer, and the at least one through-hole portion of the reflective layer is positioned at a position corresponding to the at least one light source assembled to a surface of the base layer.

The plurality of conductors are made flexible in order not to break when the base layer undergoes shape deformation.

The terminal portion is assembled to an edge portion of a shape after deformation of the base layer or opposite side of the base layer that is not joined to the reflective layer.

The reflective layer and the base layer are joined to each other by polymer melting.

The polymer melting is lamination.

The reflective layer and the base layer are polymer softened by heat using a mold having a shape that is identical to a final shape of the illumination device so that the reflective layer and the base layer together undergo shape deformation into the final shape of the illumination device.

The polymer softening is thermoformation.

The final shape of the illumination device is obtained by cutting the reflective layer and the base layer.

In providing the plurality of conductors on a surface of the base layer, a portion of the conductor corresponding to a portion in which the reflective layer and the base layer together undergo shape deformation during forming in order to obtain the final shape of the illumination device does not have to be joined to the base layer, and the other portion of the conductor corresponding to the portion in which neither of the reflective layer nor the base layer undergoes shape deformation may be joined to the base layer.

According to the invention, it is possible to provide an illumination device having a simple structure that can be assembled in a facilitated manner and with reduced costs, and a method of manufacturing such an illumination device.

BRIEF DESCRIPTION OF DRAWINGS

FIG. 1 is a drawing schematically showing an illumination device according to an embodiment of the invention, wherein.

FIG. 2 is a drawing showing a state after deformation of the illumination device of FIG. 1, wherein.

FIG. 4 is a drawing in which FIG. 4A to FIG. 4G are sectional views illustrating each step of a method of manufacturing the illumination device of FIG. 1.

FIG. 5 is a drawing for explaining a variant embodiment of the illumination device of FIG. 1, wherein.

FIG. 6 is a sectional view indicating a variant embodiment of the conductor in the illumination device of FIG. 5, wherein.

FIG. 7 is a sectional view indicating another variant embodiment of the conductor in the illumination device of FIG. 5, wherein.

FIG. 8 is drawing in which

FIG. 9 is a drawing in which FIG. 9A is a partial perspective view showing a variant of the conductor compensation portion; and FIG. 9B is a partial perspective view showing a variant of the conductor compensation portion.

FIG. 10 is a partially exploded perspective view showing a variant of the illumination device in FIG. 1.

DESCRIPTION OF EMBODIMENTS

Hereinafter, preferred embodiments of the invention will be described in detail with reference to the attached drawings.

Figure 1A:
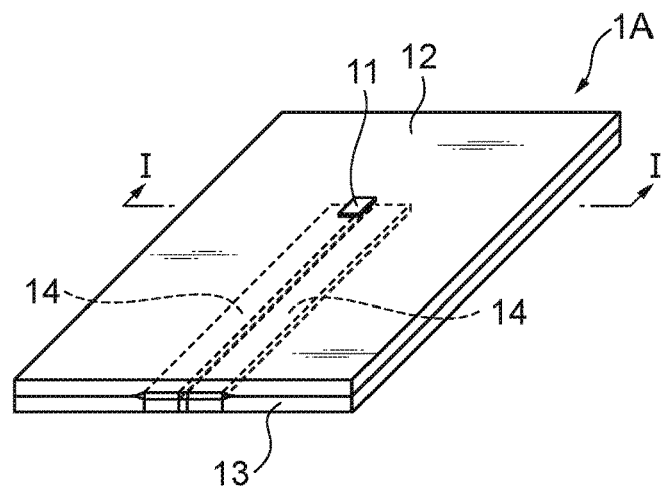
FIG. 1A is a perspective view.
Figure 1B:
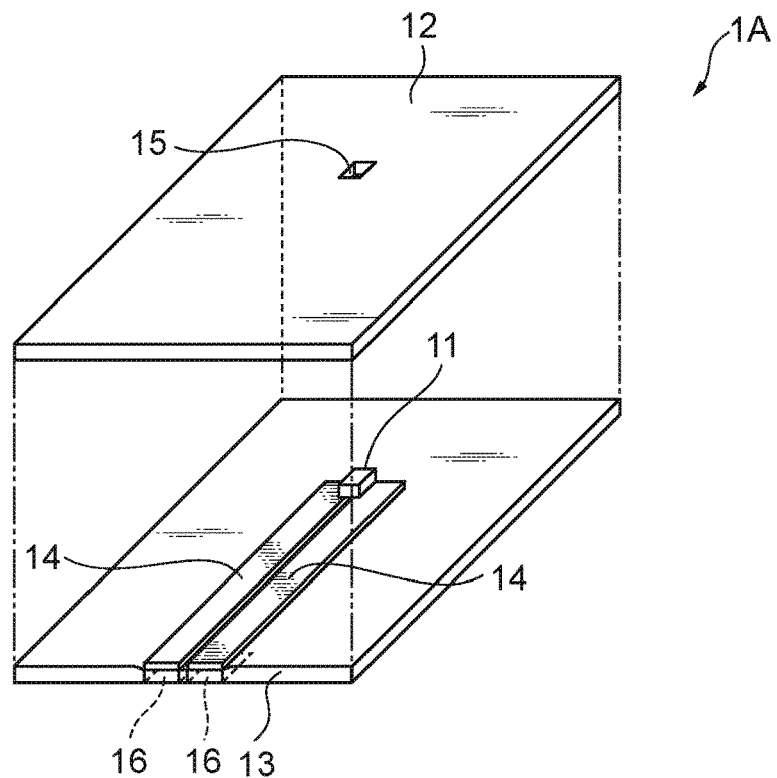
FIG. 1B is an exploded perspective view.
Figure 1C:
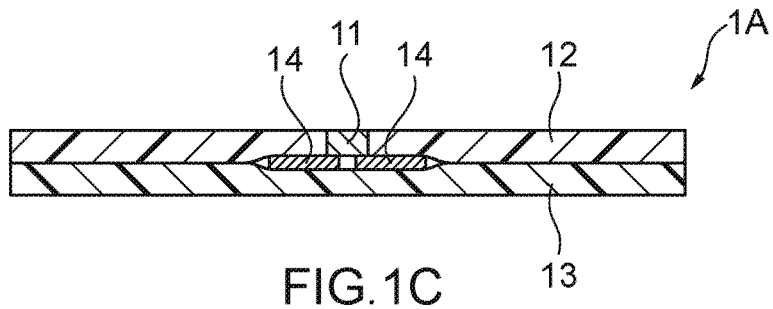
FIG. 1C is a sectional view taken along line I-I in FIG. 1A.

FIG. 1 is a drawing schematically showing an illumination device (also referred to as a luminaire) according to an embodiment of the invention, wherein: FIG. 1A is a perspective view; FIG. 1B is an exploded perspective view; and FIG. 1C is a sectional view taken along line I-I in FIG. 1A. The illumination device of FIG. 1 is shown by way of example, and the configuration of the illumination device according to the invention is not limited the configuration shown in FIG. 1.

A shown in FIG. 1A to FIG. 1C, an illumination device 1A includes a light source 11, a reflective layer 12 that is disposed to reflect light from the light source 11 and to direct the light out of the illumination device 1A to provide illumination, a base layer 13 made of a thermoformed resin (also referred to as a thermoplastic) for holding the light source 11 and for holding the reflective layer 12, conductors 14 and 14 disposed on the base layer 13 and connected to the light source 11 to supply power to the light source 11, and a through-hole portion 15 provided in the reflective layer 12 to emit light from the light source 11 to outside.

The light source 11 is, for example, an LED light source. In the present embodiment, the illumination device 1A is provided with a single light source 11, but, it is not limited thereto, and at least one light source may be provided depending on design. In this case, the at least one light source described above may include at least one LED light source.

The reflective layer 12 is an optical reflective part having a planar geometry, such as a thin plate, a sheet or a thin layer, and is made of a thermoformable resin (also referred to as a thermoformable plastic), such as a thermoplastic resin. Preferably, the reflective layer 12 is made of foamed PET (polyethylene terephthalate) such as MCPET (registered trademark). The reflective layer 12 is highly reflective, and reflects light from the light source 11 at a high reflectance.

In a case where the reflective layer has a transmittance of 1 to 5%, optical efficiency of the illumination device is affected. Thus by combining the reflective layer 12 with the base layer 13 made of a thermoformed resin having an extremely small transmittance, particularly made of a thermoplastic resin having an extremely small transmittance, optical reflectance of the illumination device 1A can be maximized, and optical efficiency can be improved.

In a case where the reflective layer 12 is MCPET, total reflectance is greater than or equal to 99% and diffuse reflectance is greater than or equal to 96% taken as relative values with respect a barium sulfate white board of 550 nm. Also, MCPET has a transmittance of approximately 1.5% with a thickness of 0.5 mm to 1 mm. Further, MCPET is has a high stiffness, and can be subjected to secondary processing such as bending or molding. Further, although a reflection member made of normal plastics cannot meet a required level, PCPET has flame retardancy and thus can meet a required flammability level.

The reflective layer 12 has the through-hole portion 15 penetrating therethrough in a thickness direction thereof. The through-hole portion 15 is positioned at a position corresponding to the light source 11 assembled to a surface of the base layer 13 and the geometry (shape and measure) of the through-hole portion 15 is substantially or essentially identical with that of the light source 11 assembled onto the surface of the base layer 13. Thereby, light from the light source 11 either leaves directly the illumination device 1A through the through-hole portion 15 or is reflected back from the surface of the opposite side of the reflective layer 12 which is not connected to the base layer 13. In the present embodiment, the illumination device 1A is provided with one through-hole portion 15, but it is not limited thereto, and at least one through-hole portion may be provided depending on design.

The base layer 13 is a base part placed to assemble the light source 11 and the plurality of conductors 14 and 14 and is made of a thermoformed resin. The base layer 13 can be disposed as a PCB (printed circuit board) to assemble all electronic components including, in addition to the light source 11 and the plurality of conductors 14 and 14, other electric components such as a diode, a transistor and various kinds of IC sensors such as a smoke sensor, an optical sensor, a heat sensor, and a humidity sensor. As described above, the base layer 13 has all electric components assembled to the base layer 13, and thus plays two roles, which is to provide a function as the illumination device 1A, as well as a function of providing mechanical characteristics of the structure of the illumination device 1A such as stiffness, flame retardancy, non-shrinkage, electric insulation, and thermal conduction.

It is preferable that the reflective layer 12 and the base layer 13 are joined with each other by polymer melting. This polymer melting is the laminating which, for example, adheres the reflective layer 12 and the base layer 13 with each other. Also, it is preferable that the reflective layer 12 and the base layer 13 have an identical shape.

The thickness of the reflective layer 12 is preferably 0.01 mm to 5 mm, and more preferably, 0.5 mm to 1 mm. The thickness of the base layer 13 is preferably 0.1 mm to 10 mm and more preferably 1 mm to 2 mm.

The conductors 14 and 14 are sandwiched between the reflective layer 12 and the base layer 13 to extend along a longitudinal direction of the base layer 13 having a rectangular shape, and are disposed in a parallel so as not to come into contact with each other. The conductors 14 and 14 are made flexible so as not to break when the base layer 13 is deformed. The conductors 14 and 14 are one of metal sheets, metal pads, metal foils, wire rods and patterned conductors on a PCB, among which patterned conductors on a PCB are preferable. Power supply to the light source 11 on the base layer 13 and other optical and electrical characteristics (e.g., color and light intensity of the LED light source) can be changed or adjusted with the arrangement of the conductors 14 and 14 (e.g., patterned conductors on the PCB) and the arrangement of other electric components. The conductors 14 and 14 may be made of copper or copper alloy, aluminum or aluminum alloy, or other metal or an alloy thereof. In addition, in a case where the conductors 14 and 14 have a flattened shape, the conductors 14 and 14 are capable of functioning as a heatsink of the light source 11.

The conductors 14 and 14 are fixed to the base layer 13. For example, the conductor 14 is fixed to the base layer 13 by thermal lamination such as pressing, adhesion using an adhesive, ultrasonic welding, thermal welding, or laser welding.

The conductors 14 and 14 have terminal portions 16 and 16 for connecting a power supply to the light source 11. The terminal portions 16 and 16 are assembled to the conductors 14 and 14 at an edge portion (see FIG. 2) of a shape after deformation of the base layer 13 or opposite side of the base layer that is not connected to the reflective layer 12. These terminal portions 16 and 16 are assembled to the conductors 14 and 14 on a one-to-one basis, and it is preferable that they are respectively provided integrally with the conductors 14 and 14.

Figures 2A, 2B:
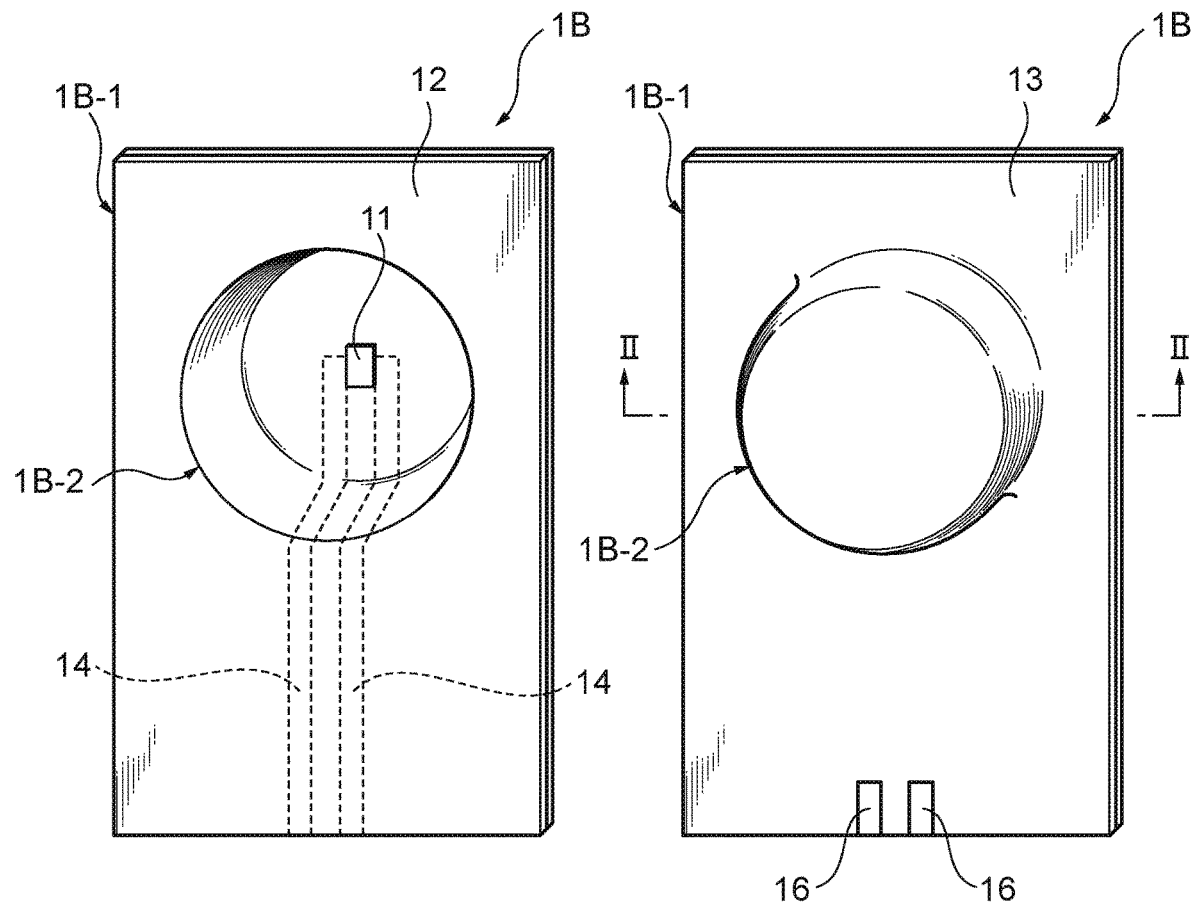
FIG. 2A is a plan view.
FIG. 2B is a bottom plan view.
Figure 2C:
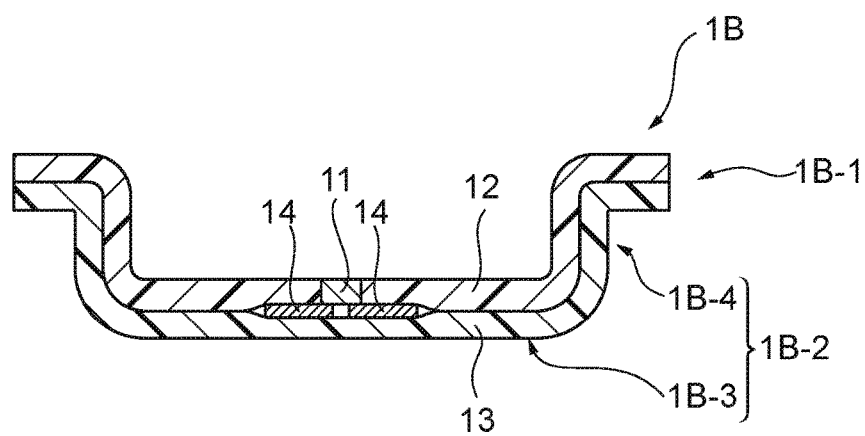
FIG. 2C is a sectional view taken along line II-II in FIG. 2A.

FIG. 2 is a drawing showing a state after deformation of the illumination device of FIG. 1, wherein: FIG. 2A is a plan view; FIG. 2B is a bottom plan view; and FIG. 2C is a sectional view taken along line II-II in FIG. 2A.

As shown in FIG. 2A to FIG. 2C, the illumination device 1B has a laminated structure including the reflective layer 12 and the base layer 13 that are laminated, and the laminated structure has a flat portion 1B-1 and a recessed portion 1B-2. The recessed portion 1B-2 is formed integrally with the flat portion 1B-1 by thermoforming. In other words, the illumination device 1B has a protruded portion corresponding to the recessed portion 1B-2, the protruded portion that is protruded from the reflective layer 12 side to the support 13 side in a thickness direction of the flat portion 1B-1. Accordingly, the illumination device 1B of FIG. 2 is the basically same as the illumination device 1A of FIG. 1, except the recessed portion 1B-2. It is preferable that the reflective layer 12 and the base layer 13 are of the same geometry.

The flat portion 1B-1 has a sheet shape or a thin plate shape, and has a substantially rectangular shape in a plan view. The geometry of the flat portion 1B-1 in a plan view can be made into other shapes such as a circle, an ellipse or a polygon depending on design. The flat portion 1B-1 has a thickness of 1 mm to 5 mm.

The recessed portion 1B-2 is a three-dimensionally molded dome-shaped portion, and has an annular shape or a substantially annular shape in a sectional view in a direction of the plane. The recessed portion 1B-2 a trapezoid or a generally trapezoid shape in a sectional view in a thickness direction. Like the flat portion 1B-1, the recessed portion 1B-2 has a thickness of 1 mm to 5 mm.

The sectional shape in the direction of the plane and the sectional shape in the direction of the thickness of the recessed portion 1B-2 may be other shapes such as a circle, an ellipse or a polygon depending on design. Further, in the present embodiment, the recessed portion 1B-2 is formed to have a continuous surface, but it may be formed to have a discontinuous surface with one or a plurality of through-hole portions or a mesh structure.

The recessed portion 1B-2 has a base wall 1B-3 and a side wall 1B-4, and the base wall 1B-3 and the side wall 1B-4 are formed integrally. In the present embodiment, the light source 11 is placed at a substantially central part in a plan view of the base wall 1B-3 (FIG. 2A). The conductors 14 and 14 extend from the light source 11 to the edge portion 1B-5 of the flat portion 1B-1 via the base wall 1B-3 and the side wall 1B-4 and are connected to the terminal portion 16 and 16 at the edge portion 1B-5.

Figure 3:
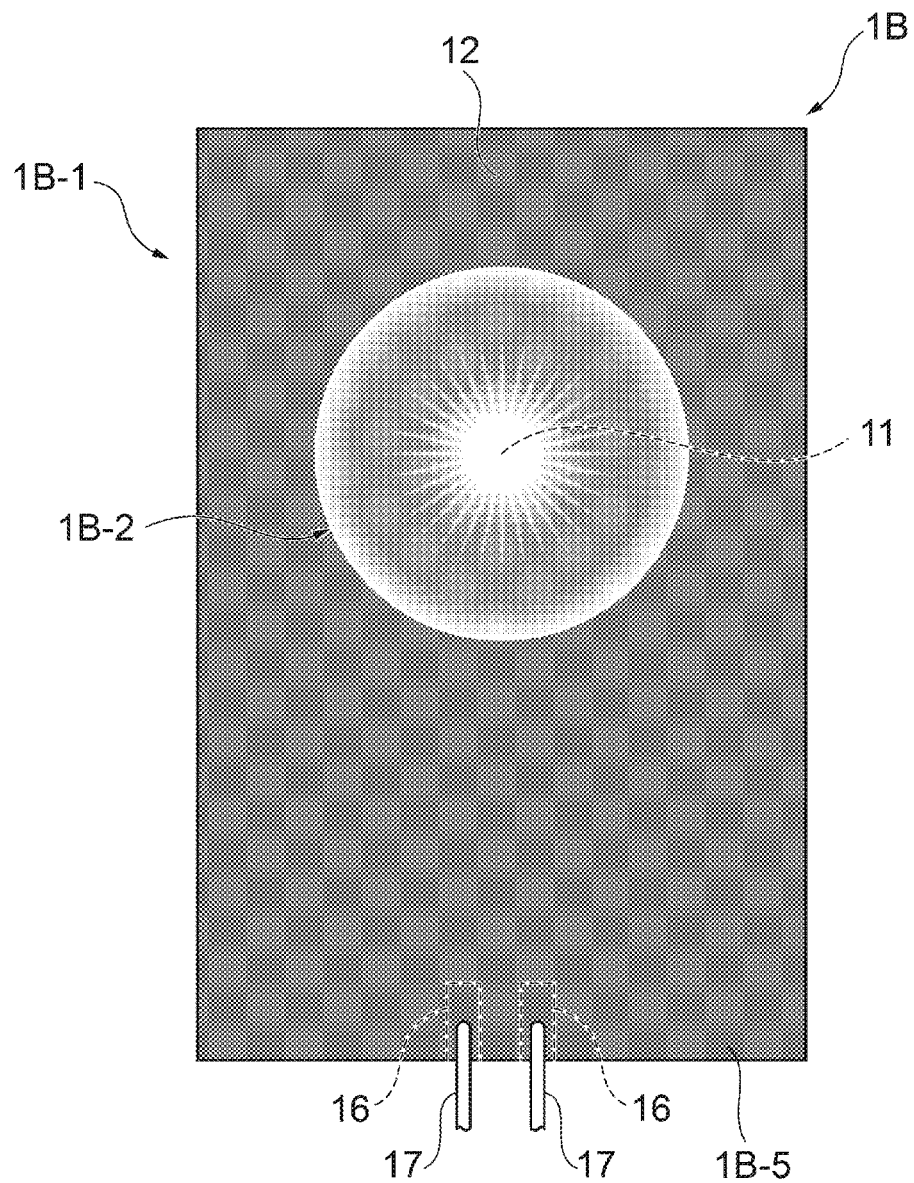
FIG. 3 is a plan view showing a state where power is supplied to the illumination device of FIG. 2.

FIG. 3 is a plan view showing a state where power is supplied to the illumination device 1B of FIG. 2. Terminals 17 and 17, which may be of a clip type, are connected to the terminal portions 16 and 16, respectively. One is a positive terminal and the other is a negative terminal. When power is supplied from outside via the terminals, power is supplied to the light source 11, and light is emitted from the light source 11.

The light emitted from the light source 11 is roughly categorized into direct light and reflected light, and the reflected light varies depending on the geometry of the base wall 1B-3 and the side wall 1B-4 of the recessed portion 1B-2. Accordingly, a light emitting position when the illumination device 1B is viewed from the reflective layer 12 side can be changed by changing the shape, the dimension or the like of the recessed portion 1B-2 depending on design. In this embodiment, when the user sees the illumination device 1B from the reflective layer 12 side, both the direct light emitted from the light source 11 and the reflected light that has reflected off the side wall 1B-4 reach the user. Thereby, a circular light emitting part corresponding to the light source 11 and a ring-shaped light emitting part surrounding the light emitting part and corresponding to side wall 1B-4 are viewed.

A method of manufacturing the illumination device 1A and 1B shown in FIG. 2 will be described with reference to FIG. 4.

First, the reflective layer 12 as a thermoformable resin sheet is prepared, and further, the base layer 13 as a thermoformed resin sheet is prepared (FIG. 4A). Also, a mold 20 having a shape which is the same as a shape (final shape) of the illumination device 1B to be obtained at a final stage is prepared (see FIG. 4F). For example, the mold is a metal mold for plastics which is a metal mold having an elongated geometry with an end portion in the longitudinal direction being R-chamfered.

Thereafter, the conductors 14 and 14 are provided on and fixed to a surface 13a of the base layer 13 (FIG. 4B), and further, the terminal portions 16 and 16 of the conductors 14 and 14 are provide to supply power to the light source 11. The terminal portions 16 and 16 are assembled to an edge portion 1B-5 of a shape after deformation of the base layer 13 to be described below and/or assembled to a surface 13b on an opposite side of the base layer 13 that is not joined to the reflective layer 12. The conductors 14 and 14 may be formed integrally with the terminal portions 16 and 16. In such a case, after having provided the conductors 14 and 14 on the surface 13a of the base layer 13, the terminal portions 16 and 16 may be provided on the surface 13b on an opposite side of the base layer 13 or on a side surface of the base layer 13 by bending end portions of the conductors 14 and 14.

Moreover, in this process in which the conductors 14 are provided on the surface 13a of the base layer 13, it is preferable that a portion of the conductor 14 corresponding to a portion in which the reflective layer 12 and the base layer 13 together undergo shape deformation during forming in order to obtain the final shape of the illumination device 1B, that is, an intermediate portion of the conductor 14 in a longitudinal direction, for example, is not joined to the base layer 13, and the other portion of the conductor 14 corresponding to a portion in which neither of the reflective layer 12 nor the base layer 13 undergoes shape deformation, that is, both end portions of the conductor 14 in the longitudinal direction, for example, is joined to the base layer (see FIG. 10).

Then, the conductors 14 and 14 to which the light source 11 is connected are provided on the surface 13a of the base layer 13 (FIG. 4C). The light source 11 is attached at an end portion of the conductor 14 and 14 so as to be across the conductors 14 and 14, and fixed to both of the conductors 14 and 14 with an adhesive material such as solder.

Thereafter, a through-hole portion 15 is provided in the reflective layer 12 (FIG. 4D), and then the reflective layer 12 is placed on the base layer 13 such that the conductor 14 and 14 are positioned between the reflective layer 12 and the base layer 13 (FIG. 4E). Here, the position of the through-hole portion 15 is accurately placed directly above the position of the light source 11 and the shape of through-hole portion 15 is identical to the shape of the light source 11.

Then, the reflective layer 12 is positioned above the base layer 13 such that light from the light source 11 either leaves directly the illumination device 1A through the through-hole portion 15 or is reflected back from the surface 12a of the opposite side of the reflective layer 12 which is not connected to the base layer 13, and also such that the through-hole portion 15 of the reflective layer 12 is positioned at a position corresponding to the light source 11 assembled onto the surface 13a of the base layer 13 (FIG. 4E).

Then, with the conductors 14 and 14 being interposed between the reflective layer 12 and the base layer 13, the reflective layer 12 and the base layer 13 are joined by thermoforming. The reflective layer 12 and the base layer 13 are preferably joined by polymer melting, but may be joined to each other via another member such as an adhesive material.

Subsequently, the reflective layer 12 and the base layer 13 are polymer softened by heat using a mold 20 having a shape which is the same as the final shape of the illumination device 1B so that the reflective layer 12 and the base layer 13 together undergo shape deformation into the final shape of the illumination device 1B (FIG. 4F). Such polymer softening is thermoforming, and polymer softening is performed by pressing the mold heated to a predetermined temperature against the surface 12a of the reflective layer 12. For example, the mold is a metal mold, and formed using one or a plurality of metal molds. The mold has a rod-shape, but it may have other shapes such as a shape of a hat, a shape of a flower, or a shape of a bottle. Note that although the polymer melting and the polymer softening may be performed by different processes, they are preferably performed by a single step for simplification of the manufacturing process.

During this, the conductor 14 and 14 stretch along with the deformation of the reflective layer 12 and the base layer 13 do not break because of their flexibility, and thus sufficient conduction is ensured between the light source 11 and the terminal portions 16 and 16. In a case where the conductors 14 and 14 are metal sheets of copper or copper alloy or aluminum or aluminum alloy, the ductility is high and can easily stretch along with the deformation of the reflective layer 12 and the base layer 13.

Subsequently, the edge portion in a direction of plane of the integrated reflective layer 12 and the base layer 13 is cut depending on design, and the final shape of the illumination device 1B having the flat portion 1B-1 and the recessed portion 1B-2 (FIG. 4G) is obtained.

As described above, the illumination device 1A includes a light source 11, a reflective layer 12 disposed to reflect light from the light source 11 and to direct the light out of the illumination device 1A to provide illumination, a base layer 13 made of thermoformed resin to hold the light source 11 and to hold the reflective layer 12, and a plurality of conductors 14 and 14 disposed on the base layer 13 and connected to the light source 11 to supply power to the light source 11. Accordingly, the illumination device 1A can be obtained by simply integrating the light source 11, the reflective layer 12, the base layer 13, the conductors 14 and 14 and the terminal portions 16 and 16, assembling can be performed with a simple configuration and production cost can be reduced. Also, the illumination device 1B can be manufactured by designing the mold and integrating the light source 11, the conductors 14 and 14 and the terminal portions 16 and 16 with the base layer 13, and thereafter joining the reflective layer 12 and the base layer 13 with each other using the aforementioned mold and also heat deforming them. Thus, a manufacturing process of the illumination device 1B can be simplified into a single main step, which is thermoforming.

Also, the illumination device 1B manufactured as described above is capable of immediately emitting light from the light source 11 by simply supplying power to the terminal portions 16 and 16, and thus can be easily used for automobile products and lighting equipment used indoor or outdoor. Further, a highly versatile illumination device can be provided since the user of the illumination device 1B can cut the flat portion 1B-1 into a desired shape except for a portion where the conductors 14 and 14 are sandwiched, when applying to an automobile product or a lighting equipment.

Further, based on a particular design of the illumination device 1A, the light source 11, the conductors 14 and 14 and other electric components such as a diode, a transistor, various kinds of IC sensors (e.g., a smoke sensor, an optical sensor, a heat sensor and/or a humidity sensor) can be disposed on the base layer 13 as elements of a circuit board. Thereby, (i) illumination devices 1A or 1B satisfying various specification requirements in many fields including a car industry can be supplied to a user by a smart operation, and (ii) all the above electric components can be stacked to the base layer 13 and the reflective layer 12 by thermoforming the base layer 13 and the reflective layer 12 on a top face thereof. Thereby, electric, humidity and moisture insulating properties can be ensured, and the illumination device 1A or 1B can be used both outdoor and indoor.

Figure 5A:
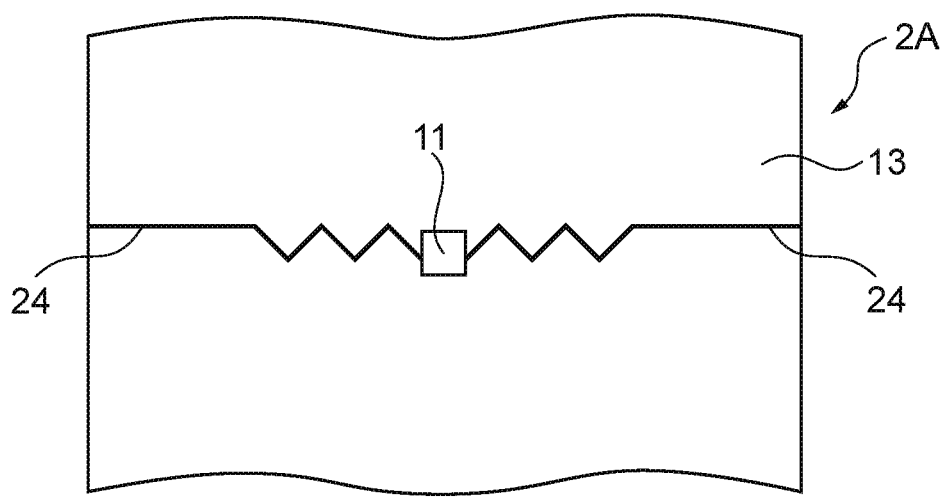
FIG. 5A is a diagram showing a configuration of a conductor before deformation.
Figure 5B:
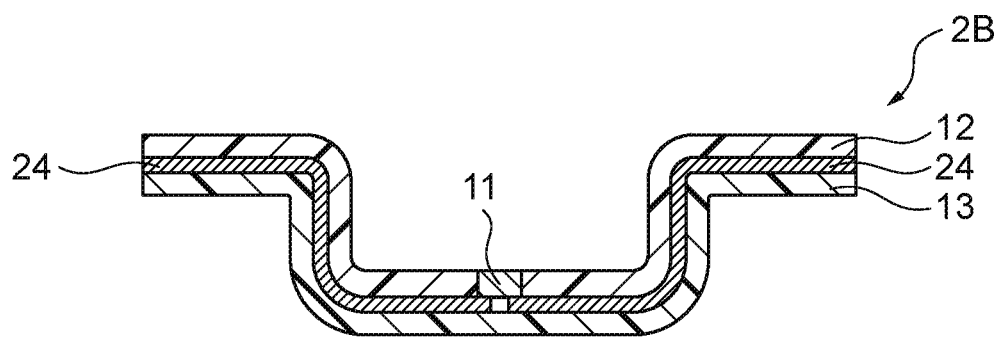
FIG. 5B is a sectional view showing a configuration of a conductor after deformation.

FIG. 5 is a drawing for explaining a variant embodiment of the illumination device 1A or 1B of FIG. 1, wherein: FIG. 5A is a diagram showing a configuration of a conductor before deformation; and FIG. 5B is a sectional view showing a configuration of a conductor after deformation.

As shown in FIG. 5A, an illumination device 2A is placed on the base layer 13, and is provided with conductors 24 and 24 to be connected to the light source 11 to supply power to the light source 11. The conductors 24 and 24 are sandwiched between the reflective layer 12 and the base layer 13 to extend along a widthwise direction of the base layer 13 having a rectangular shape. One of the conductors 24 and 24 extends from the light source 11 to one edge portion in the widthwise direction (left-hand side) of the base layer 13 in a plan view, and the other extends from the light source 11 to the other edge portion in the widthwise direction (right-hand side) of the base layer 13.

The conductors 24 and 24 have a zigzag shape on the base layer 13. By this zigzag shape, when the reflective layer 12 and the base layer 13 deforms three-dimensionally, the conductors 24 and 24 follow the deformation of the reflective layer 12 and the base layer 13 and deform three-dimensionally (FIG. 5B). Thus, the conductors 24 and 24 can easily deform along with the deformation of the reflective layer 12 and the base layer 13, and a reliable flexibility and conduction can be ensured in the illumination device 2B after deformation.

The conductors 24 and 24 have a zigzag shape, but it is not limited thereto, and may have a meander shape or a labyrinth shape. The meander shape or the labyrinth shape can be formed into a shape similar to the wire rod by providing notches in alternation at both ends in the widthwise direction of the conductor 24 before placing the reflective layer 12 on the base layer 13. Since the conductors 24 and 24 have a meander shape or a labyrinth shape, a further reliable flexibility and conduction can be ensured.

Figure 6A:
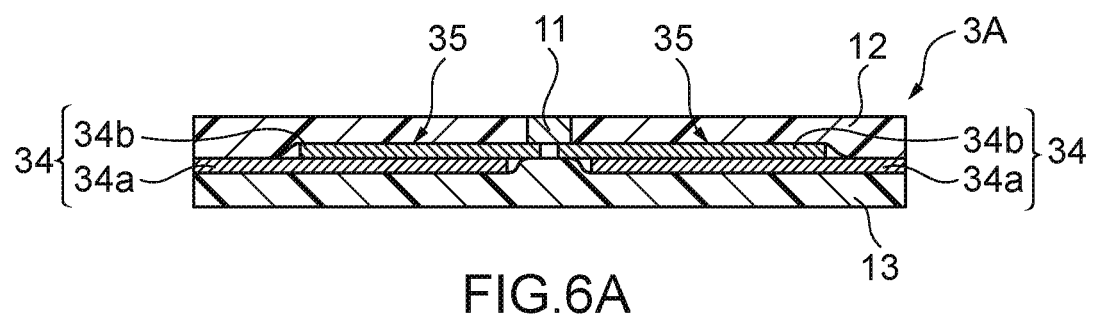
FIG. 6A is a diagram showing a state before deformation.
Figure 6B:
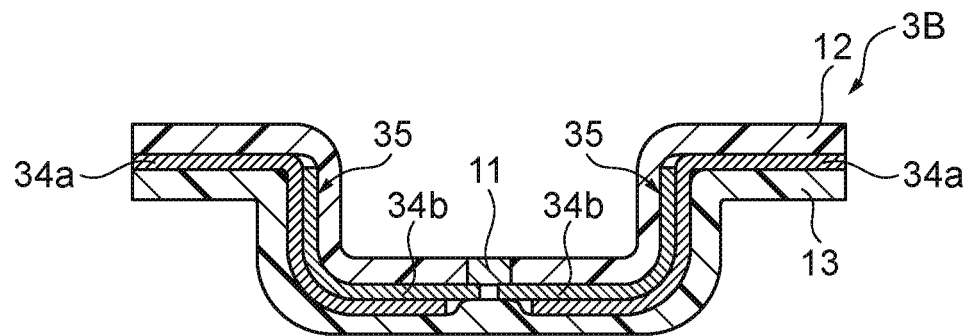
FIG. 6B is a diagram showing a state after deformation.

FIG. 6 is a sectional view indicating a variant embodiment of the conductor 24 in the illumination device 2A or 2B of FIG. 5, wherein: FIG. 6A is a diagram showing a state before deformation; and FIG. 6B is a diagram showing a state after the deformation. Since the illumination device of FIG. 6 is basically the same as the illumination device of FIG. 5, overlapping description is omitted and different parts will be described below.

As shown in FIG. 6, an illumination device 3A is placed on the base layer 13, and is provided with conductors 34 and 34 to be connected to the light source 11 to supply power to the light source 11. The conductor 34 has a first conductor 34a placed on the surface 13a of the base layer 13 and a second conductor 34b placed on a side of the first conductor 34a opposite to the base layer 13. The conductor 34 has a slide portion 35 at a position where the first conductor 34a and the second conductor 34b are placed on top of each other, and the second conductor 34b is slidably attached along a longitudinal direction of the first conductor 34a and on the first conductor 34a.

When the reflective layer 12 and the base layer 13 are deformed three-dimensionally, the second conductor 34b slides on the first conductor 34a at the slide portion 35, and along with the deformation of the reflective layer 12 and the base layer 13, the conductors 34 and 34 deform three-dimensionally (FIG. 6B). The movement of the second conductor 34b in the widthwise direction is restricted by a joint between the reflective layer 12 and the base layer 13, and the second conductor 34b slides while maintaining a surface contact with the first conductor 34a. Thus, the conductors 34 and 34 can be easily deformed along with the deformation of the reflective layer 12 and the base layer 13, and a reliable flexibility and conduction can be obtained for the illumination device 3B after the deformation.

Figure 7A:
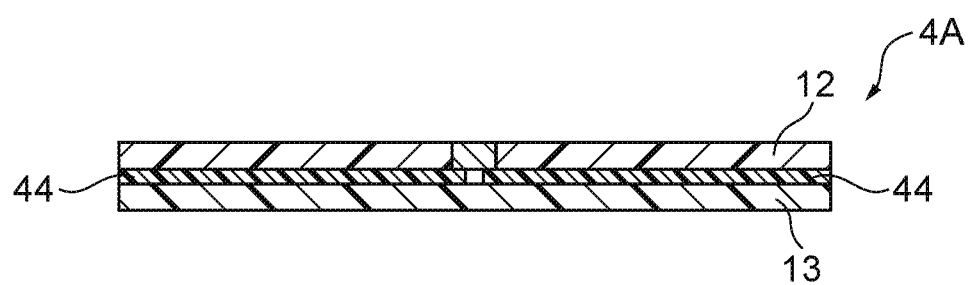
FIG. 7A is a diagram showing a state before deformation.
Figure 7B:
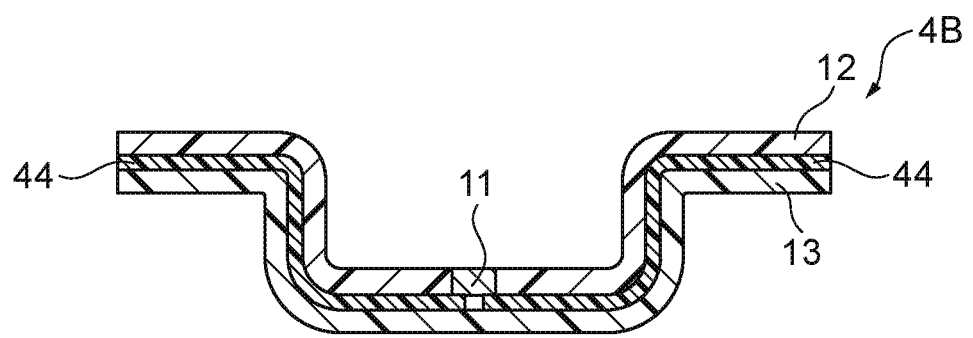
FIG. 7B is a diagram showing a state after deformation.

FIG. 7 is a sectional view indicating another variant embodiment of the conductor in the illumination device 2A and 2B of FIG. 5, wherein: FIG. 7A is a diagram showing a state before deformation; and FIG. 7B is a diagram showing a state after the deformation. Since the illumination device of FIG. 7 is also basically the same as the illumination device of FIG. 5, overlapping description is omitted and different parts will be described below.

As shown in FIG. 7, an illumination device 4A is placed on the base layer 13, and is provided with conductors 44 and 44 to be connected to the light source 11 to supply power to the light source 11. The conductors 44 and 44 are made of an electrically conductive resin wire rod, which is, for example, a resin wire rod containing an electrically conductive filler having a spherical shape, needle shape, flake-shaped or an irregular shape. For example, a wire rod having conductivity that is equivalent to a copper alloy can be selected as an electrically-conductive filler component resin rod.

When the reflective layer 12 and the base layer 13 are deformed three-dimensionally, the conductors 44 and 44 deform three-dimensionally along with the deformation of the reflective layer 12 and the base layer 13 (FIG. 7B), similarly to the case of FIG. 5B. Here, in the conductors 44 and 44, the resin of a base material stretches while maintaining conduction. Thus, the conductors 44 and 44 can be easily deformed along with the deformation of the reflective layer 12 and the base layer 13, a reliable flexibility and conduction can be obtained for the illumination device 4B after the deformation.

Also, since the mass of the conductive resin rod is smaller than that of metal, the illumination device 4A or 4B can be lightweighted. Also, in a case where the light source 11 is an LED light source, light can be emitted with a low voltage, and thus a high voltage source is not required. Accordingly, by selecting a conductive resin rod having conductivity equivalent to that of metal, particularly conductivity equivalent to a copper alloy, it is possible to provide an illumination device that is more lightweight than a case where a metal conductor is used and that has conductivity equivalent to metal such as a copper alloy.

Effect of the Invention

According to the invention, an illumination device can be made into a laminated structure or a flattened structure by assembling electric components flatly, a special technique is not required and assembling can be facilitated. Also, by thermoforming the laminated structure or the flattened structure into a three dimensional shape, it is possible to provide an illumination device having a three-dimensional structure including a light source, a conductor, a reflective layer and a base layer. Further, the laminated structure can be formed into a flattened shape or into a roll shape, and such a laminated structure having a flattened shape can be produced in one factory.

Also, the final shape of the illumination device can be formed in one step in accordance with the requirement of the user. Further, since a plurality of electric components constituting an illumination device are laminated between two resins layer, the electric components can be protected from water, moisture or dust.

The illumination device and a method of manufacturing the same according to the present embodiment are described above, but the invention is not limited to the embodiment described above, and various alterations and modifications are possible based on a technical concept of the invention.

Figure 8A:
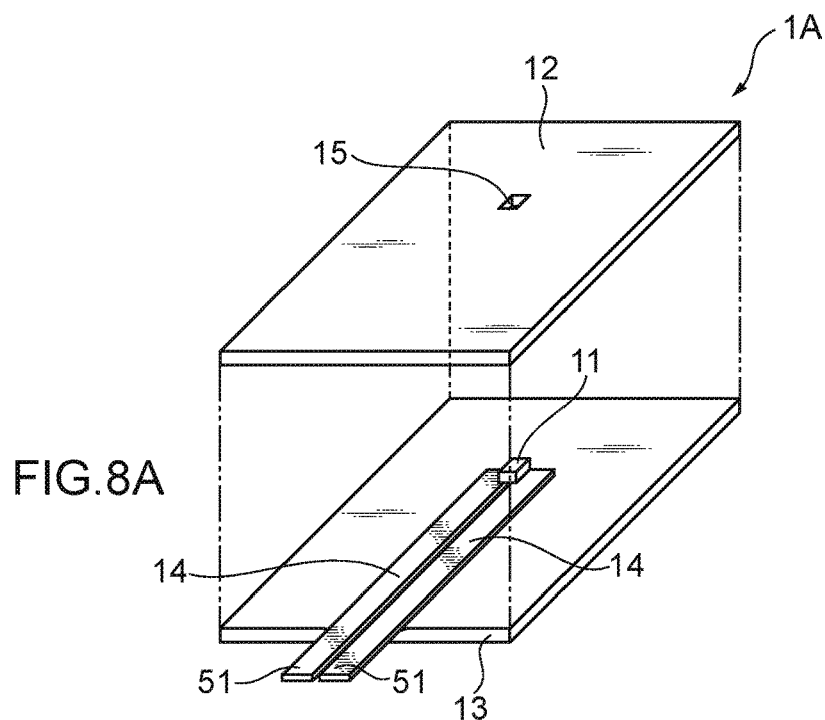
FIG. 8A is an exploded perspective view showing a conductor compensation portion provided on the conductor.

For example, the conductor 14 may have a conductor compensation portion which compensates for elongation of the conductor in the longitudinal direction. The conductor compensation portion is a projection portion 51 which protrudes from an outer edge portion of the base layer 13, for example, as shown in FIG. 8A.

Figure 8B:
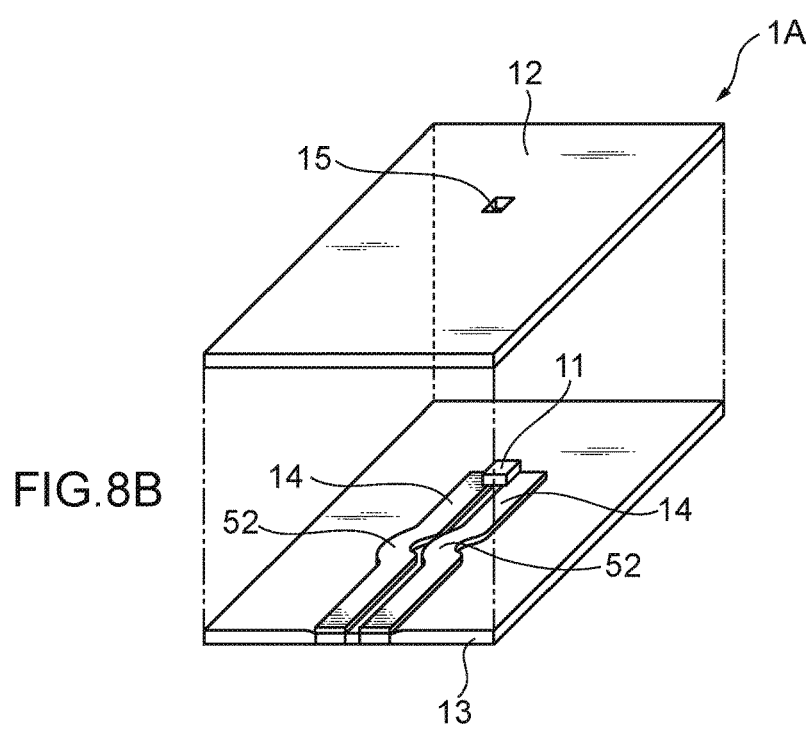
FIG. 8B is an exploded perspective view showing a variant of the conductor compensation portion.

Moreover, the conductor compensation portion may be a bent portion 52 in which a part of the conductor 14 is bent with respect to the longitudinal direction thereof as shown in FIG. 8B. This bent portion 52 has a U-shape or a C-shape on a plan view of the base portion 13 but may have other shapes such as an S-shape.

Figure 8C:
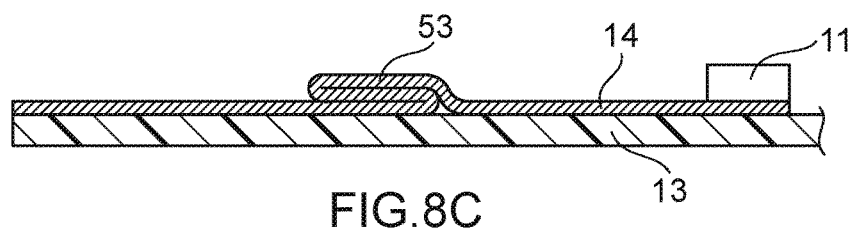
FIG. 8C is a longitudinal sectional view showing a variant of the conductor compensation portion.

The conductor compensation portion may be a folded portion 53 in which a part of the conductor 14 is folded with respect to the longitudinal direction thereof as shown in FIG. 8C. This folded portion 53 constitutes an overlapping portion overlapped with respect to a thickness direction of the base layer 13, for example.

Moreover, the conductor compensation portion may have at least one recessed portion extending in a direction crossing the longitudinal direction thereof. The at least one recess portion is constituted by a plurality of recessed portions 54, 54, . . . extending toward an inner side from both end portions of the conductor 14 in a width direction, for example, and formed along the width direction of the conductor 14 as shown in FIG. 9A. Moreover, as shown in FIG. 9B, the at least one recessed portion may be constituted by a plurality of recessed portions 55, 55, . . . extending toward the inner side from the both end portions of the conductor 14 in the width direction and formed with inclination to the width direction or to the longitudinal direction of the conductor 14.

As described above, by providing the conductor compensation portion on the conductor 14, the conductor 14 can be deformed by following the deformation of the reflective layer 12 and the base layer 13 during forming, and electrical connection between the both end portions of the conductor 14 in the longitudinal direction can be maintained. Thus, in a state where the reflective layer 12 and the base layer 13 are formed to the desired final shapes, reliability of power supply when power is supplied to the light source 11 through the conductor 14 from outside can be improved.

Moreover, as shown in FIG. 10, the portion of the conductor 14 corresponding to the portion in which the reflective layer 12 and the base layer 13 together undergo shape deformation during the forming of the final shape of the illumination device, that is, the intermediate portion 14a of the conductor 14 in the longitudinal direction, for example, is not joined to the base layer 13, and the other portion of the conductor 14 corresponding to the portion in which neither of the reflective layer 12 nor the base layer 13 undergoes shape deformation, that is, one end portion 14b of the conductor 14 in the longitudinal direction, for example, may be joined to the base layer 13. In other words, in a light-source neighboring region 61 which is neighboring to the light source 11, the one end portion 14b of the conductor 14 is joined to the base layer 13, and in a region other than that, the conductor 14 does not have to be joined to the base layer 13.

As a result, while adhesion of the conductor 14 on the base layer 13 is simplified, insulating reliability of the conductors 14 and 14 can be ensured, and the conductor 14 can be deformed easily by following the deformation of the reflective layer 12 or the base layer 13 during forming, and reliability of power supply to the light source 11 after the forming can be improved.

Moreover, the other portion of the conductor 14 corresponding to the portion in which none of the reflective layer 12 and the base layer 13 undergoes shape deformation, that is, the other end portion 14c of the conductor 14 in the longitudinal direction, for example, may be joined to the base layer 13. In other words, it is preferable that, in an outer-edge neighboring region 62 including the outer edge portion of the base layer 13, the other end portion 14c of the conductor 14 is joined to the base layer 13. As a result, while reliability of power supply to the light source 11 after forming is improved, insulating reliability of the conductors 14 and 14 can be improved.

LIST OF REFERENCE SIGNS 1A illumination device
1B illumination device
2A illumination device
2B illumination device
3A illumination device
3B illumination device
4A illumination device
4B illumination device
11 light source
12 reflective layer
12a surface
13 base layer
13a surface
13b surface
14 conductor
15 through-hole portion
16 terminal portion
17 terminal
1B-1 flat portion
1B-2 recessed portion
1B-3 base wall
1B-4 side wall
1B-5 edge portion
20 mold
24 conductor
34 conductor
34a first conductor
34b second conductor
35 slide portion
44 conductor

The invention claimed is:

1. An illumination device comprising:
at least one light source;
a reflective layer disposed to reflect light from the at least one light source and to direct the light out of the illumination device to provide illumination;
a base layer of a thermoformed resin to hold the at least one light source and to hold the reflective layer; and
a plurality of conductors disposed on the base layer and connected to the at least one light source to supply power to the at least one light source, wherein the reflective layer is made of thermoformed foamed polyethylene terephthalate resin.

2. The illumination device according to claim 1, wherein the at least one light source includes at least one LED light source.

3. The illumination device according to claim 1, wherein the reflective layer has a thickness of 0.5 mm to 1 mm.

4. The illumination device according to claim 1, wherein the base layer is disposed to assemble the at least one light source and the plurality of conductors thereon.

5. The illumination device according to claim 4, wherein the base layer is a printed circuit board.

6. The illumination device according to claim 4, wherein the base layer has a thickness of 0.1 mm to 10 mm.

7. The illumination device according to claim 1, wherein the conductor has a conductor compensation portion which compensates for elongation of the conductor in a longitudinal direction.

8. The illumination device according to claim 7, wherein the conductor compensation portion is a projection portion which protrudes from an outer edge portion of the base layer or the conductor compensation portion is a bent portion in which a part of the conductor is bent with respect to the longitudinal direction thereof or wherein the conductor compensation portion has at least one recessed portion extending in a direction crossing the longitudinal direction thereof.

9. The illumination device according to claim 1, wherein a portion of the conductor corresponding to a portion in which the reflective layer and the base layer together undergo shape deformation during forming is not joined to the base layer, and the other portion of the conductor corresponding to a portion in which neither of the reflective layer nor the base layer undergoes shape deformation is joined to the base layer.

10. The illumination device according to claim 1, wherein the plurality of conductors are any one of metal sheets, metal pads, metal foils, wire rods, and pattern conductors.

11. The illumination device according to claim 10, wherein the plurality of conductors are pattern conductors on a printed circuit board.

12. The illumination device according to claim 1, further comprising
at least one through-hole portion provided in the reflective layer to emit light from the at least one light source to outside.

13. The illumination device according to claim 12, wherein the reflective layer and the base layer have an identical shape.

14. The illumination device according to claim 13, wherein the reflective layer is assembled onto the base layer with a plurality of conductors being located between the reflective layer and the base layer.

15. The illumination device according to claim 14, wherein the at least one light source is a single LED light source assembled onto a surface of the base layer, the at least one through-hole is a single through-hole positioned at a position corresponding to the single LED light source so that light from the single LED light source either leaves directly the illumination device through the single through-hole portion or is reflected back from the surface of the opposite side of the reflective layer which is not connected to the base layer.

16. The illumination device according to claim 15, wherein the plurality of conductors have a terminal portion for connecting a power supply to the single LED light source.

17. A method of manufacturing an illumination device, the method comprising:
preparing a reflective layer as a thermoformable resin sheet;
preparing a base layer as a thermoformed resin sheet;
providing a plurality of conductors on a surface of the base layer;
providing a terminal portion of the plurality of conductors to supply power to at least one light source;
providing the at least one light source whereto the plurality of conductors are connected on a surface of the base layer;
providing at least one through-hole portion in the reflective layer;

placing the reflective layer on the base layer so that the plurality of conductors are positioned between the reflective layer and the base layer; and positioning the reflective layer on the base layer so that light from the at least one light source either leaves directly the illumination device through the at least one through-hole portion or is reflected back from a surface on an opposite side of the reflective layer that is not connected to the base layer, and the at least one through-hole portion of the reflective layer is positioned at a position corresponding to the at least one light source assembled to a surface of the base layer, wherein the plurality of conductors are made flexible in order not to break when the base layer undergoes shape deformation.

18. The method of manufacturing an illumination device according to claim 17, wherein the terminal portion is assembled to an edge portion of a shape after deformation of the base layer or opposite side of the base layer that is not joined to the reflective layer.

19. The method of manufacturing an illumination device according to claim 18, wherein the reflective layer and the base layer are joined to each other by polymer melting.

20. The method of manufacturing an illumination device according to claim 19, wherein the polymer melting is lamination.

21. The method of manufacturing an illumination device according to claim 19, wherein the reflective layer and the base layer are polymer softened by heat using a mold having a shape that is identical to a final shape of the illumination device so that the reflective layer and the base layer together undergo shape deformation into the final shape of the illumination device.

22. The method of manufacturing an illumination device according to claim 21, wherein the polymer softening is thermoformation.

23. The method of manufacturing an illumination device according to claim 21, wherein the final shape of the illumination device is obtained by cutting the reflective layer and the base layer.

24. The method of manufacturing an illumination device according to claim 17, wherein in providing the plurality of conductors on the surface of the base layer, the portion of the conductor corresponding to the portion in which the reflective layer and the base layer together undergo shape deformation during forming in order to obtain the final shape of the illumination device is not joined to the base layer, and the other portion of the conductor corresponding to the portion in which neither of the reflective layer nor the base layer undergoes shape deformation is joined to the base layer.

* * * * *